(12) United States Patent
Park et al.

(10) Patent No.: US 10,725,340 B2
(45) Date of Patent: Jul. 28, 2020

(54) QUANTUM DOT, COLOR CONVERSION PANEL, AND DISPLAY DEVICE INCLUDING THE SAME

(71) Applicants: SAMSUNG DISPLAY CO., LTD., Yongin-si, Gyeonggi-do (KR); KOREA ADVANCED INSTITUTE OF SCIENCE AND TECHNOLOGY, Daejeon (KR)

(72) Inventors: Kyoung Won Park, Yongin-si (KR); Baek Hee Lee, Yongin-si (KR); Min Ki Nam, Yongin-si (KR); Hyeok Jin Lee, Yongin-si (KR); Keun Chan Oh, Yongin-si (KR); Jae Jin Lyu, Yongin-si (KR); Baek Kyun Jeon, Yongin-si (KR); Sungjun Koh, Daejeon (KR); Doh Chang Lee, Daejeon (KR)

(73) Assignees: Samsung Display Co., Ltd., Yongin-si (KR); Korea Advanced Institute of Science and Technology, Daejeon (KR)

( * ) Notice: Subject to any disclaimer, the term of this patent is extended or adjusted under 35 U.S.C. 154(b) by 251 days.

(21) Appl. No.: 15/806,629

(22) Filed: Nov. 8, 2017

(65) Prior Publication Data
US 2018/0231843 A1   Aug. 16, 2018

(30) Foreign Application Priority Data

Feb. 14, 2017 (KR) .................. 10-2017-0019970

(51) Int. Cl.
*G02F 1/1335* (2006.01)
*G02F 1/13357* (2006.01)
(Continued)

(52) U.S. Cl.
CPC .. *G02F 1/133617* (2013.01); *G02F 1/133509* (2013.01); *G02F 1/133512* (2013.01);
(Continued)

(58) Field of Classification Search
CPC ............. G03F 7/0007; G02F 1/133514; G02F 1/133516; G02F 2001/133614;
(Continued)

(56) References Cited

U.S. PATENT DOCUMENTS

2006/0040103 A1   2/2006   Whiteford et al.
2011/0272668 A1   11/2011   Taylor et al.
(Continued)

FOREIGN PATENT DOCUMENTS

KR     10-1176510 B1    8/2012
KR     10-1576043 B1    12/2015
(Continued)

OTHER PUBLICATIONS

One-pot Synthesis of Highly Luminescent InP/ZnS Nanocrystals without Precursor Injection, J. Am. Chem. Soc. 2008, 130, 11588-11589 (Aug. 2008).
(Continued)

*Primary Examiner* — John A McPherson
(74) *Attorney, Agent, or Firm* — Lewis Roca Rothgerber Christie LLP

(57) ABSTRACT

A quantum dot, a color conversion panel, and a display device, the quantum dot including a core; and a shell layer positioned outside of the core, wherein at least one of the core and the shell layer is doped with aluminum, silicon, titanium, magnesium, or zinc, and the core includes a Group III-V compound.

13 Claims, 9 Drawing Sheets

(51) Int. Cl.
- *B82Y 20/00* (2011.01)
- *G02F 1/1333* (2006.01)
- *B82Y 40/00* (2011.01)
- *B82Y 30/00* (2011.01)
- *G03F 7/00* (2006.01)

(52) U.S. Cl.
CPC .. *G02F 1/133514* (2013.01); *G02F 1/133528* (2013.01); *B82Y 20/00* (2013.01); *B82Y 30/00* (2013.01); *B82Y 40/00* (2013.01); *G02F 2001/133357* (2013.01); *G02F 2001/133565* (2013.01); *G02F 2001/133614* (2013.01); *G02F 2202/36* (2013.01); *G03F 7/0007* (2013.01); *Y10S 977/774* (2013.01); *Y10S 977/816* (2013.01); *Y10S 977/818* (2013.01); *Y10S 977/819* (2013.01); *Y10S 977/82* (2013.01); *Y10S 977/821* (2013.01); *Y10S 977/824* (2013.01); *Y10S 977/825* (2013.01); *Y10S 977/882* (2013.01); *Y10S 977/95* (2013.01); *Y10S 977/952* (2013.01)

(58) Field of Classification Search
CPC ........... G02F 1/133617; Y10S 977/774; Y10S 977/952; Y10S 977/815; Y10S 977/816; Y10S 977/818; Y10S 977/819; Y10S 977/82; B82Y 20/00

USPC .............................................. 430/7; 349/106
See application file for complete search history.

(56) References Cited

U.S. PATENT DOCUMENTS

| | | | |
|---|---|---|---|
| 2013/0242228 A1* | 9/2013 | Park | G02F 1/133377 349/61 |
| 2015/0194577 A1 | 7/2015 | Glarvey et al. | |
| 2016/0084476 A1 | 3/2016 | Koole et al. | |
| 2016/0218252 A1* | 7/2016 | Steckel | H01L 33/60 |
| 2016/0250612 A1 | 9/2016 | Oldenburg et al. | |
| 2017/0247614 A1* | 8/2017 | Li | C09K 11/883 |

FOREIGN PATENT DOCUMENTS

| | | |
|---|---|---|
| KR | 10-1641016 B1 | 7/2016 |
| KR | 10-2016-0105460 A | 9/2016 |
| WO | WO 2015/101779 A1 | 7/2015 |

OTHER PUBLICATIONS

General Method for the Synthesis of Ultrastable Core/Shell Quantum Dots by Aluminum Doping, J. Am. Chem. Soc. 2015, 137, 12430-12433 (Sep. 2015).

\* cited by examiner

QUANTUM DOT, COLOR CONVERSION PANEL, AND DISPLAY DEVICE INCLUDING THE SAME

CROSS-REFERENCE TO RELATED APPLICATION

Korean Patent Application No. 10-2017-0019970 filed on Feb. 14, 2017, in the Korean Intellectual Property Office, and entitled: "Quantum Dot, Color Conversion Panel, and Display Device Including the Same," is incorporated by reference herein in its entirety.

BACKGROUND

1. Field

Embodiments relate to a quantum dot, a color conversion panel, and a display device including the same.

2. Description of the Related Art

A quantum dot (QD) is a nano-sized semiconductor particle having a quantum confinement effect and showing excellent optical and electrical characteristics without a general semiconductor material in a bulk state. When the quantum dot is stimulated by energy such as light, it may emit light, and a color of the emitted light may change according to the size of the particle.

By utilizing this quantum dot, it is possible to implement a large-area high-resolution display device with good color purity, excellent color reproducibility, and a good motion picture characteristic.

The above information disclosed in this Background section is only for enhancement of understanding of the background of the invention and therefore it may contain information that does not form the prior art that is already known in this country to a person of ordinary skill in the art.

SUMMARY

Embodiments are directed to a quantum dot, a color conversion panel, and a display device including the same.

The embodiments may be realized by providing a quantum dot including a core; and a shell layer positioned outside of the core, wherein at least one of the core and the shell layer is doped with aluminum, silicon, titanium, magnesium, or zinc, and the core includes a Group III-V compound.

The Group III-V compound may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNAs, GaAlNSb, GaAlPAs, GaAlPSb, GaInNP, GaIn-NAs, GaInNSb, GaInPAs, GaInNSb, GaAlNP, InAlNP, InAlNAs, InAlNSb, InAlPAs, InAlPSb, or a mixture thereof.

The core may further include a Group II-VI compound, and the core may include an alloy of the Group III-V compound and the Group II-VI compound.

The Group II-VI compound may include CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgSe, HgZnS, HgZnSe, HgZnTe, MgZnSe, MgZnS, HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof.

The shell layer may include a first portion adjacent to the core and a second portion farther from the core than the first portion, and the second portion of the shell layer may be doped with aluminum, silicon, titanium, magnesium, or zinc.

The shell layer may include a first portion adjacent to the core and a second portion farther from the core than the first portion, and the core and the first portion of the shell layer may be doped with aluminum, silicon, titanium, magnesium, or zinc.

The core may include In and P, the shell layer may include Zn, Se, or S, and at least one of the core and the shell layer may be doped with aluminum.

The embodiments may be realized by providing a color conversion panel including a substrate; a first color conversion layer and a second color conversion layer positioned on the substrate; a planarization layer covering the first color conversion layer and the second color conversion layer; and a polarization layer positioned on the planarization layer, wherein each of the first color conversion layer and the second color conversion layer includes a plurality of semiconductor nanoparticles, each semiconductor nanoparticle of the plurality of semiconductor nanoparticles includes a core and a shell layer positioned outside of the core, and at least one of the core and the shell layer is doped with aluminum, silicon, titanium, magnesium, or zinc.

The core may include a Group III-V compound.

The core may further include a Group II-VI compound, and the core may include an alloy of the Group III-V compound and the Group II-VI compound.

The color conversion panel may further include a light filter layer positioned between the planarization layer and the color conversion layer, wherein the light filter layer includes a plurality of layers, and the plurality of layers have a structure in which at least two layers having different refractive indexes are alternately arranged.

The polarization layer may include a polarization pattern including a metal material, and an insulating layer covering the polarization pattern.

The color conversion panel may further include a light blocking layer positioned between the first color conversion layer and the second color conversion layer.

The shell layer may include a first portion adjacent to the core and a second portion farther from the core than the first portion, and the second portion of the shell layer may be doped with aluminum, silicon, titanium, magnesium, or zinc.

The shell layer may include a first portion adjacent to the core and a second portion farther from the core than the first portion, and the core and the first portion of the shell layer may be doped with aluminum, silicon, titanium, magnesium, or zinc.

The embodiments may be realized by providing a display device including a display panel; a color conversion panel overlapping the display panel; and a liquid crystal layer positioned between the display panel and the color conversion panel, the liquid crystal layer including a liquid crystal material, wherein the color conversion panel includes a substrate; a first color conversion layer and a second color conversion layer positioned between the substrate and the liquid crystal layer; a planarization layer covering the first color conversion layer, the second color conversion layer, and the liquid crystal layer; a polarization layer positioned between the planarization layer and the liquid crystal layer; and an electrode positioned between the polarization layer and the liquid crystal layer, wherein each of the first color conversion layer and the second color conversion layer includes a plurality of semiconductor nanoparticles, wherein each semiconductor nanoparticle of the plurality of semiconductor nanoparticles includes a core and a shell layer positioned outside of the core, and wherein at least one of the core and the shell layer is doped with aluminum, silicon, titanium, magnesium, or zinc.

The polarization layer may include a polarization pattern including a metal material, and an insulating layer covering the polarization pattern.

The color conversion panel may further include a light blocking layer positioned between the first color conversion layer and the second color conversion layer.

A width of the light blocking layer may gradually increase along a direction from the substrate toward the planarization layer.

The core may include the Group III-V compound, or an alloy of the Group III-V compound and the Group II-VI compound.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
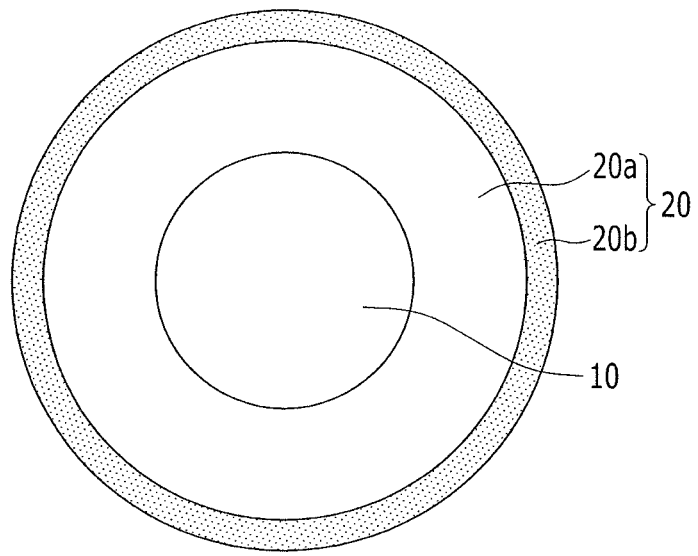
FIG. 1 illustrates a view showing a quantum dot according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout. As used herein, the term "or" is not an exclusive term, e.g., "A or B" includes A alone, B alone, or A and B together.

Components unrelated to the description may be omitted in order to describe the embodiments.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" means positioning above or below the object portion, but does not essentially mean positioning on the upper side of the object portion based on a gravity direction.

In addition, unless explicitly described to the contrary, the word "comprise" and variations such as "include," "includes," "including," "comprises" or "comprising" will be understood to imply the inclusion of stated elements but not the exclusion of any other elements.

Further, in the specification, the phrase "on a plane" or "in plan view" means viewing the object portion from the top, and the phrase "on a cross-section" means viewing a cross-section of which the object portion is vertically cut from the side.

FIG. 1 illustrates a view showing a quantum dot according to according to an exemplary embodiment of the present disclosure.

Referring to FIG. 1, a quantum dot according to the present exemplary embodiment may include a core 10 and a shell layer 20 enclosing the core 10 (e.g., on an outside of the core 10). In an implementation, the shell layer 20 may include, e.g., a first portion 20a (e.g., first shell layer) adjacent to the core 10 and a second portion 20b (e.g., second shell layer) farther from core 10 than the first portion 20a (e.g., on an outside of the first shell layer). The first portion 20a may be thicker than the second portion 20b. In an implementation, the second portion 20b of the shell layer 20 may be doped with a metal material. The doped metal material may include, e.g., aluminum, silicon, titanium, magnesium, or zinc. The metal material doped at an outside of the shell layer 20 may have or be in an oxide form.

The core 10 may include a Group III-V compound. In an implementation, the Group III-V compound may be selected from a group including, e.g., a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a four-element compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof.

The shell layer 20 may include at least one among Zn, Se, and S. In an implementation, the shell layer 20 may be, e.g., ZnSeS, ZnSe, or ZnS.

In an implementation, the core 10 may include, e.g., an alloy of the Group III-V compound and a Group II-VI compound. In an implementation, the Group II-VI compound may be selected from, e.g., a group of two-element compounds selected from CdSe, CdTe, ZnS, ZnSe, ZnTe, ZnO, HgS, HgSe, HgTe, MgSe, MgS, and a mixture thereof; a group of three-element compounds selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a group of four-element compounds selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Table 1 indicates a degree of a change in a light maintenance rate by hard-baking the quantum dot made of only the core and the shell layer and an InPZnS/ZnSeS/ZnS:Al quantum dot doped with the aluminum, respectively. The quantum dot made of only the core and the shell layer is a Comparative Example, and the InPZnS/ZnSeS/ZnS:Al quantum dot made of aluminum is an Example. In Table 1, hard-bake 1, hard-bake 2, hard-bake 3, and hard-bake 4 represent 30 min, 60 min, 90 min, and 120 min as an elapsed time of the hard-bake, respectively. Here, the hard-bake 4 is a case of additionally increasing a temperature condition to 230° C.

TABLE 1

|  | Soft-bake | Exposure | Hard-bake 1 | Hard-bake 2 | Hard-bake 3 | Hard-bake 4 |
| --- | --- | --- | --- | --- | --- | --- |
| Condition | 100° C., 3 min | UV 100 mJ | 180° C., 30 min | 180° C., 60 min | 180° C., 90 min | 230° C., 120 min |
| Comparative Example | 100% | 90.3% | 79.3% | 54.3% | 57.9% | 42.9% |
| Example | 100% | 99.2% | 99% | 96.1% | 95.9% | 92.8% |

In Table 1, in a case that the Comparative Example and the Example both undergo a soft-bake process, although the light maintenance rate was 100%, when UV exposure and the hard-bake were performed, the light maintenance rate gradually decreased. However, according to the Example, compared with the Comparative Example, it may be seen that a reduction width of the light maintenance rate was very small and the light maintenance rate was higher by about 50% in the hard-bake 4. Table 1 only represents the experiment result for the InPZnS/ZnSeS/ZnS:Al quantum dot, however if the metal such as aluminum is doped to the quantum dot having the various cores according to the above-described present exemplary embodiment, a similar light maintenance rate effect to the exemplary embodiment shown in Table 1 may be obtained.

Figure 2:
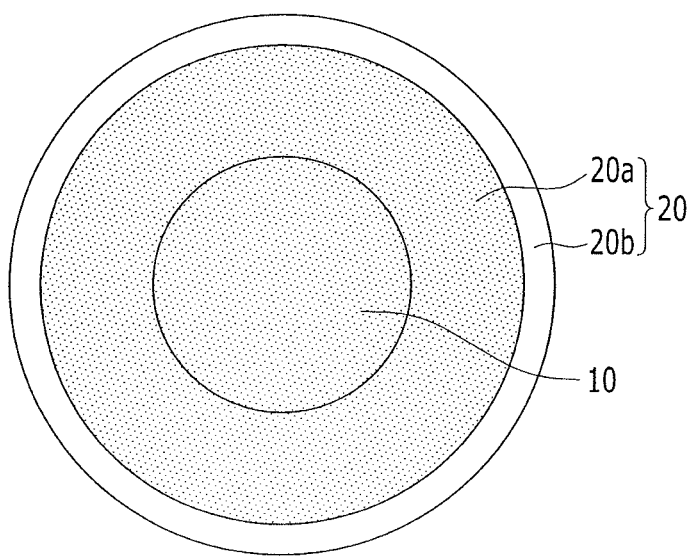
FIG. 2 illustrates a view showing a quantum dot according to a modified exemplary embodiment of FIG. 1.

FIG. 2 illustrates a view showing a quantum dot according to a modified exemplary embodiment of FIG. 1.

Referring to FIG. 2, different from the exemplary embodiment described in FIG. 1, the core 10 and the first portion 20a of the shell layer 20 may be doped with the metal material, rather than doping the second portion 20b of the shell layer 20. Except for this difference, the content described in FIG. 1 may all be applied to the present exemplary embodiment.

Figure 3:
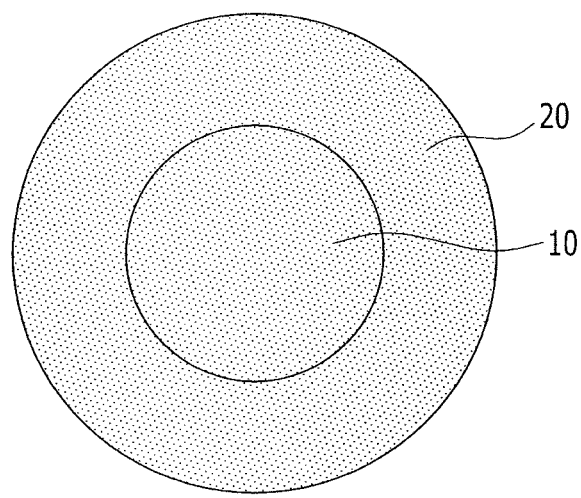
FIG. 3 illustrates a view showing a quantum dot according to a modified exemplary embodiment of FIG. 1.

FIG. 3 illustrates a view showing a quantum dot according to a modified exemplary embodiment of FIG. 1.

Referring to FIG. 3, different from the exemplary embodiments described in FIG. 1 and FIG. 2, both the core 10 and the shell layer 20 may be doped with the metal material. Except for this difference, the content described in FIG. 1 may all be applied to the present exemplary embodiment.

Figure 4:
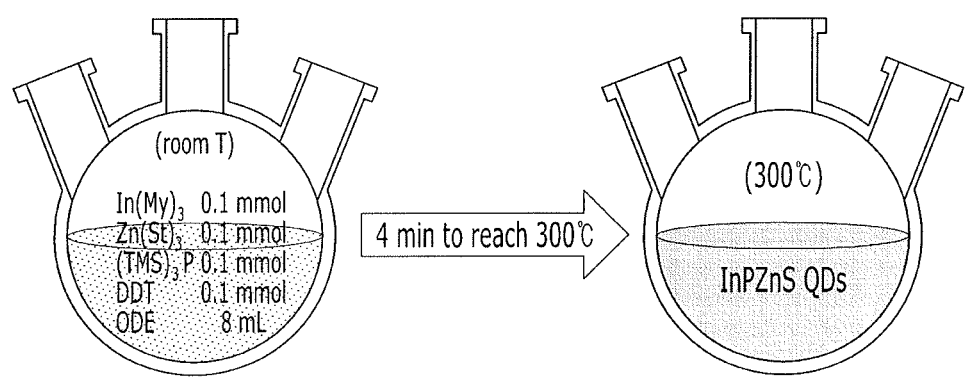
FIG. 4 to FIG. 6 illustrate views showing a quantum dot manufacturing method according to an exemplary embodiment of the present disclosure.
Figure 5:
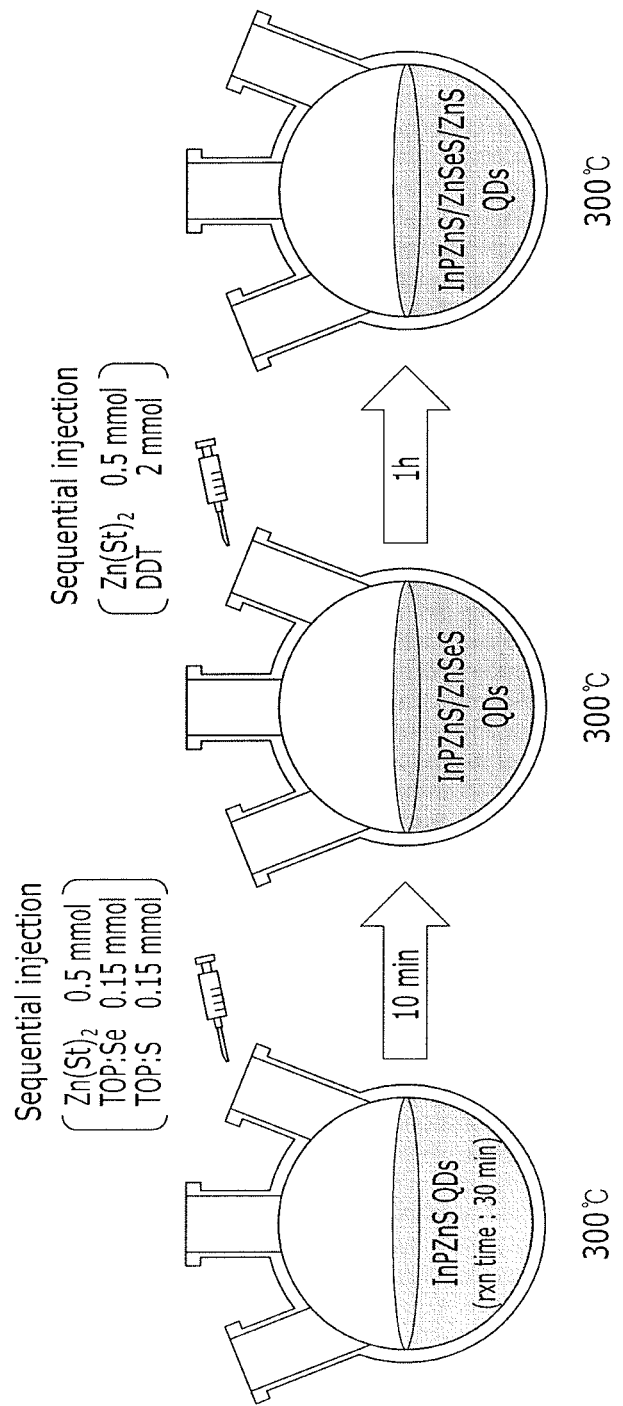
Figure 6:
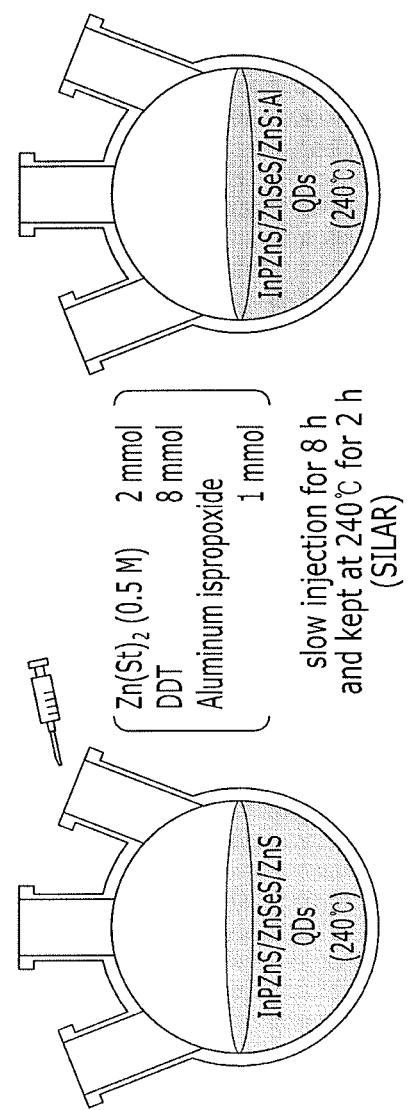

FIG. 4 to FIG. 6 illustrate views showing a manufacturing method of a quantum dot according to an exemplary embodiment of the present disclosure.

Referring to FIG. 4, a material corresponding to each precursor of In, Zn, P, and S may be put in a reaction vessel. For example, the precursors of In, Zn, P, and S may include indium myristate (In(My)$_3$), zinc stearate (Zn(St))$_2$, tris (trimethylsilyl)phosphine ((TMS)$_3$P), and 1-dodecanethiol (DDT). They may be mixed with an octadecene (ODE) solvent at ambient temperature. In an implementation, each of indium myristate (In(My)$_3$), zinc stearate (Zn(St)$_2$), tris (trimethylsilyl)phosphine ((TMS)$_3$P), and 1-dodecanethiol (DDT) may be included at 0.1 mmol, with 8 ml of the octadecene solvent. After the precursors and the solvent are mixed at ambient temperature, the mixture may be heated to about 300° C. within about 4 min. The time during which the reaction can be carried out may be set to about 20 to 30 min from the time when the heating is started. As described above, the quantum dot core made of InPZnS may be formed.

Referring to FIG. 5, after the quantum dot core reaction, the material corresponding to each precursor of Zn, Se, and S may be put in the reaction vessel including the quantum dot core material. Each precursor may be injected into the reaction vessel for about 1 min. In an implementation, the precursors of Zn, Se, and S may include zinc stearate (Zn(St)$_2$), trioctylphosphine selenium (TOP:Se), and trioctylphosphine sulfur (TOP:S), respectively. In an implementation, the content of zinc stearate (Zn(St)$_2$), trioctylphosphine selenium (TOPSe), and trioctylphosphine sulfur (TOPS) may be 0.5 mmol, 0.15 mmol, 0.15 mmol, respectively. They may be reacted for about 10 minutes at a temperature of about 300° C.

Next, 0.5 mmol of zinc stearate (Zn(St)$_2$) and 2 mmol of 1-dodecanethiol (DDT) may be put into the reaction vessel and they may be reacted for about 1 h at a temperature of about 300° C. Each precursor may be injected into the reaction vessel during for 1 min. Accordingly, the quantum dot shell made of ZnSeS/ZnS may be formed.

In an implementation, trioctylphosphine selenium (TOP: Se) (e.g., the quantum dot shell precursor described in FIG. 5) may be replaced with tributyl phosphine selenium (TBP: Se), and trioctylphosphine sulfur (TOP:S) may be replaced with tributyl phosphine (TBP:S).

Referring to FIG. 6, after the quantum dot core/shell reaction, the temperature may be decreased to about 240° C., and 2 mmol of zinc stearate (Zn(St)$_2$), 8 mmol of 1-dodecanethiol (DDT), and 1 mmol of aluminum isopropoxide (Al(O-i-Pr)$_3$) as the aluminum precursor may be put into the reaction vessel including the quantum dot shell material. In an implementation, the compound including zinc (Zn) and the aluminum precursor may be mixed at a mole ratio of 2:1. For example, when the mole ratio of the compound including zinc (Zn) and the aluminum precursor has a range of approximately 1:5 to 5:1, an effect that the light maintenance rate of the quantum dot increases may be obtained. To synthesize them by using a SILAR (successive ionic layer adsorption and reaction) method, they may be slowly injected for approximately 8 h and then may be further reacted for approximately 2 h.

After the reaction, toluene, ethanol, and acetone may be mixed in the reaction vessel and purified using a centrifugal separator to form aluminum-doped quantum dots.

Figure 7:
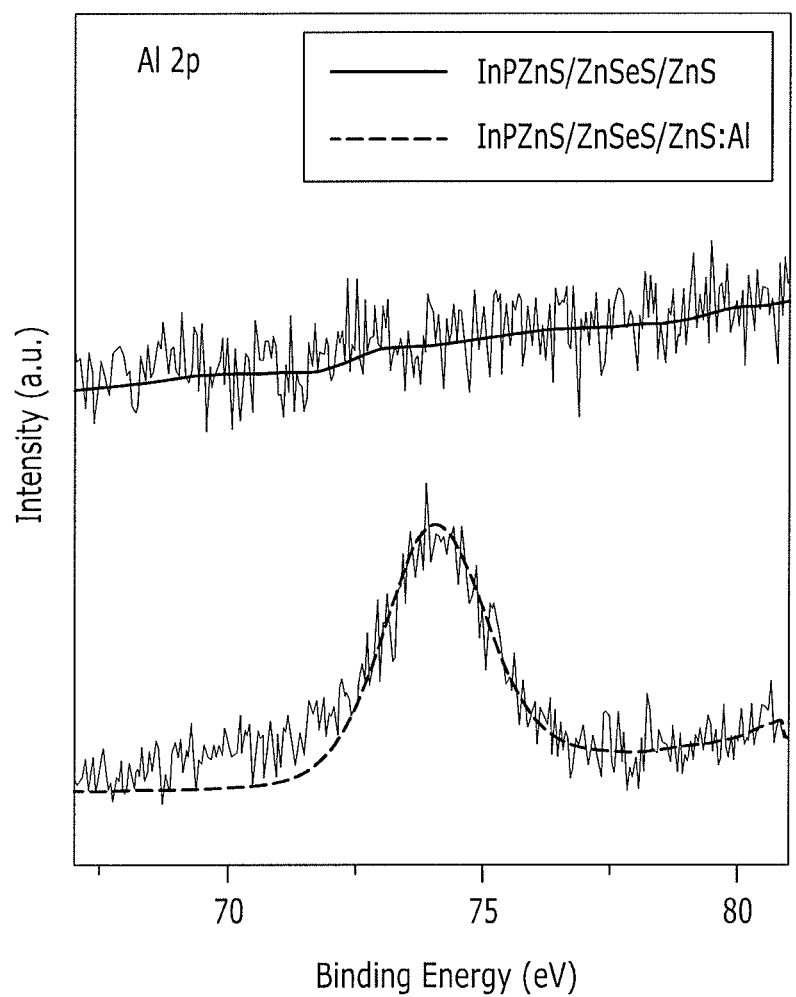
FIG. 7 illustrates a graph showing an XPS (X-ray photoelectron spectroscopy) analysis result for a quantum dot formed by a quantum dot manufacturing method according to an exemplary embodiment of the present disclosure.

FIG. 7 illustrates a graph showing an XPS (X-ray photoelectron spectroscopy) analysis result for a quantum dot formed by a quantum dot manufacturing method according to an exemplary embodiment of the present disclosure.

Referring to FIG. 7, it may be seen that the aluminum doped quantum dot was formed through an increase of a peak near a bond energy representing aluminum.

Figure 8:
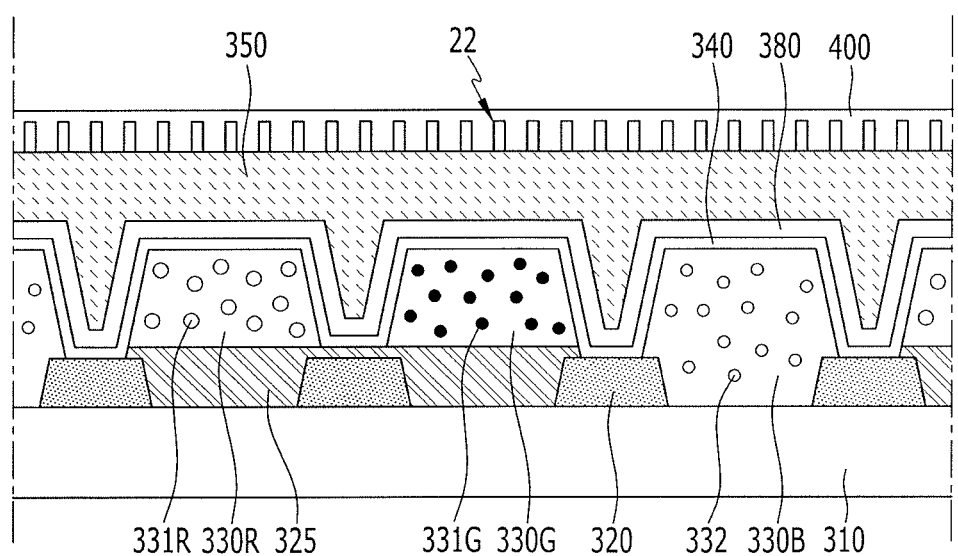
FIG. 8 illustrates a cross-sectional view showing a color conversion panel according to an exemplary embodiment of the present disclosure.

FIG. 8 illustrates a cross-sectional view showing a color conversion panel according to an exemplary embodiment of the present disclosure.

Referring to FIG. 8, in a color conversion panel, a first color conversion layer 330R and a second color conversion layer 330G may be positioned on a substrate 310. The first color conversion layer 330R and the second color conversion layer 330G may be positioned between adjacent shielding members 325. A transmission layer 330B may be positioned on the substrate 310 in a region not occupied by or underlying the first color conversion layer 330R or the second color conversion layer 330G. The light blocking layer 320 may be formed between the transmission layer 330B and the first color conversion layer 330R and between the transmission layer 330B and the second color conversion layer 330G. In an implementation, as illustrated in FIG. 8, heights of the first color conversion layer 330R, the second color conversion layer 330G, and the transmission layer 330B may be the same (e.g., a distance from the substrate to a distal surface of the first color conversion layer 330R, the second color conversion layer 330G, and the transmission layer 330B may be the same). In an implementation, the heights thereof may be different.

The light blocking layers 320 may define regions where the first color conversion layer 330R, the second color conversion layer 330G, and the transmission layer 330B adjacent to each are disposed. The first color conversion layer 330R and the second color conversion layer 330G may include a semiconductor nanoparticle (e.g. the quantum dot) and a phosphor. The first color conversion layer 330R may include a plurality of red quantum dots 331R, and the second color conversion layer 330G may include a plurality of green quantum dots 331G. Light incident to the first color conversion layer 330R may be converted into red light by the red quantum dots 331R to be emitted from the first color conversion layer 330R, and light incident to the second color conversion layer 330G may be converted into green light by the green quantum dots 331G to be emitted from the second color conversion layer 330G. The described quantum dots 331R and 331G may apply the quantum dot doped with the metal material as described above.

A planarization layer 350 may be positioned on the first color conversion layer 330R, the second color conversion layer 330G, the transmission layer 330B, and the light blocking layer 320. The planarization layer 350 may fill a valley formed between the first color conversion layer 330R and the second color conversion layer 330G, between the first color conversion layer 330R and the transmission layer 330B, and between the second color conversion layer 330G and the transmission layer 330B adjacent to each other. The planarization layer 350 may help reduce a step generated when heights of upper surfaces of layers formed before the planarization layer 350 are different.

In an implementation, the first and second color conversion layers 330R and 330G and the transmission layer 330B may include or may be formed using a photosensitive resin.

The transmission layer 330B may pass the incident light (e.g., may transmit incident light therethrough). The transmission layer 330B may transmit blue light therethrough. The transmission layer 330B may be a polymer material transmitting the blue light supplied from a light assembly as a light source, and the light assembly may provide the light incident to the color conversion panel in a direction opposite to a first direction from the substrate 310 toward the first color conversion layer 330R. For example, the transmission layer 330B corresponding to the region emitting the blue light may not include the quantum dots, and the incident blue light may pass as it is (e.g., may remain blue). The transmission layer 330B may include a plurality of scattering members or particles 332. The scattering particles 332 may scatter the light incident to the transmission layer 330B to help increase an amount of light emitted from the transmission layer 330B or to make the front luminance and the lateral luminance uniform. In an implementation, to scatter the incident light, at least one layer among the first color conversion layer 330R and the second color conversion layer 330G may also include scattering particles (e.g., as described with respect to the transmission layer 330B).

In an implementation, the scattering particles 332 may include, e.g., $TiO_2$, $Al_2O_3$, or $SiO_2$.

In an implementation, the transmission layer 330B may further include a blue pigment or a dye. The above-described scattering particle 332 may reflect the external light such that the contrast ratio could be deteriorated. Accordingly, the blue pigment or the dye may be added in the transmission layer 330B in order to help compensate for a possible deterioration in contrast ration. In an implementation, the blue pigment or the dye may absorb at least one of the red light and the green light included in the external light.

A capping layer 340 may be formed between the planarization layer 350 and the first color conversion layer 330R, between the planarization layer 350 and the second color conversion layer 330G, and between the planarization layer 350 and the transmission layer 330B. The capping layer 340 may help prevent the first and second color conversion layers 330R and 330G and the transmission layer 330B from being damaged by subsequent processes after forming the first and second color conversion layer 330R and 330G and the transmission layer 330B. For example, in a process after forming the first and second color conversion layers 330R and 330G, the quantum dots could be damaged or quenched by moisture and/or a high temperature process in the first and second color conversion layers 330R and 330G, and the capping layer 340 may help reduce and/or prevent such damage or quenching. In an implementation, the capping layer 340 may include an inorganic material, e.g., a silicon nitride.

A light filter layer 380 may be positioned between the capping layer 340 and the planarization layer 350. The light filtering layer 380 may help increase photo-efficiency by reflecting light generated in the first and second color conversion layers 330R and 330G. The light filtering layer 380 may include a plurality of layers, and the plurality of layers may have a structure in which at least two or more layers having different refractive indexes from each other are alternately arranged in a direction substantially perpendicular to the substrate 310. For example, the light filtering layer 380 may have a structure in which a silicon oxide ($SiO_x$) layer and a silicon nitride ($SiN_y$) layer are alternately arranged. In an implementation, as examples of a material having a relatively high refractive index, titanium oxide, tantalum oxide, hafnium oxide, or zirconium oxide may be used, and as an example of a material having a relatively low refractive index, $SiCO_z$ may be used. In $SiO_x$, $SiN_y$, $SiCO_3$, x, y, and z as factors determining the chemical composition ratio may be controlled depending on process conditions when forming the layers.

In an implementation, the layer nearest to the capping layer 340 among the plurality of layers forming the light filtering layer 380 may be formed of a silicon nitride layer, and the capping layer 340 may be omitted.

In an implementation, a number of layers of the light filtering layer 380 in which the layers having the different refractive indexes from each other are alternately arranged may be about ten to twenty. In an implementation, the number of layers may be selected such that the light generated from the first and second color conversion layers 330R and 330G is reflected to increase the light efficiency.

A polarization layer may be positioned on the planarization layer 350. The polarization layer may include a polarization pattern 22 (including a metal material) and an insulating layer 400 (covering the polarization pattern 22). The polarization layer may polarize the light incident from the light assembly. The polarization layer may be, e.g., a coating polarizer, a wire grid polarizer, etc. In an implementation, a reflective polarization layer for reflecting the light generated from the color conversion layer to be emitted in the direction opposite to the first direction may be used. The polarization pattern 22 may have a plurality of linear lattice structures including the metal (e.g., aluminum). The polarization pattern 22 may reflect a polarization component parallel to the polarization pattern 22, and may transmit a polarization component perpendicular to the polarization pattern 22 among the incident light.

The insulating layer 400 may help insulate the polarization pattern 22 from an electrode when the electrode is formed thereon.

As described above, the color conversion panel according to the present exemplary embodiment may include the quantum dot having a self-emission characteristic and a narrow emission spectrum such that a wide viewing angle and high color reproducibility may be realized.

Figure 9:
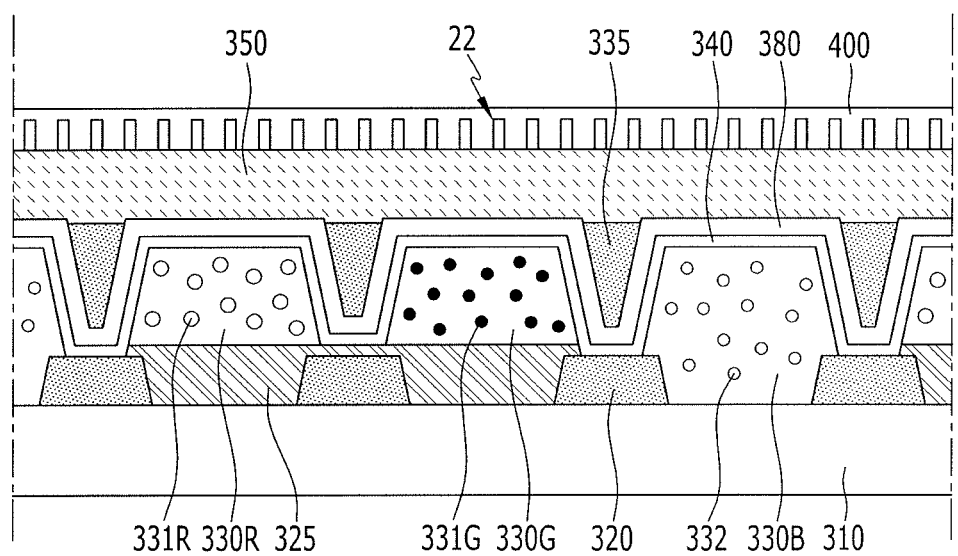
FIG. 9 illustrates a cross-sectional view showing an exemplary variation of the color conversion panel of FIG. 8.

FIG. 9 illustrates a cross-sectional view showing an exemplary variation of the color conversion panel described in FIG. 8. An exemplary embodiment of FIG. 9 is the same as most of the exemplary embodiment of FIG. 8 such that only portions having differences will be described. Most of the content described in FIG. 8 may be applied to the exemplary embodiment of FIG. 9.

Referring to FIG. 9, the light blocking layer according to the present exemplary embodiment may include a first light blocking layer 335 and a second light blocking layer 320. The first light blocking layer 335 may fill the valley formed between the first color conversion layer 330R and the second color conversion layer 330G, between the first color conversion layer 330R and the transmission layer 330B, and between the second color conversion layer 330G and the transmission layer 330B adjacent to each other. In this case, the cross-section (e.g., the width) of the first light blocking layer 335 may gradually increase along the first direction from the substrate 310 toward the first color conversion layer 330R.

The second light blocking layer 320 may be positioned between the first light blocking layer 335 and the substrate 310. In an implementation, the cross-section (e.g., the width) of the second light blocking layer 320 may gradually decrease along the first direction. The edge of the first color conversion layer 330R, the edge of the second color conversion layer 330G, and the edge of the transmission layer 330B may cover a part of the upper surface of the second light blocking layer 320, and a width of the upper surface of the second light blocking layer 320 may be larger than the width of the lower surface of the first light blocking layer 335. In an implementation, the first light blocking layer 335 and the second light blocking layer 320 may be in contact.

In an implementation, a first thickness of a portion of the planarization layer 350 overlapping the first color conversion layer 330R or the second color conversion layer 330G and a second thickness of a portion of the planarization layer 350 overlapping the first light blocking layer 335 may be substantially the same, or the second thickness may be thicker than the first thickness. For example, a step between the upper surface of the first color conversion layer 330R or the upper surface of the second color conversion layer 330G and the upper surface of the first light blocking layer 335 may not be present, or the upper surface of the first light blocking layer 335 may be lower than the upper surface of the first color conversion layer 330R or the upper surface of the second color conversion layer 330G. In an implementation, the difference of the second thickness and the first thickness may be smaller than about 1 μm. For example, the planarization characteristic to help improve the polarization characteristic of the later-described polarization layer may be important.

In an implementation, the first light blocking layer 335 may fill the valley formed between the first color conversion layer 330R and the second color conversion layer 330G, between the first color conversion layer 330R and the transmission layer 330B, and between the second color conversion layer 330G and the transmission layer 330B adjacent to each other, and the planarization characteristic of the planarization layer 350 may be further improved. To form the first light blocking layer 335, after coating a light blocking material to cover the first color conversion layer 330R, the second color conversion layer 330G, and the transmission layer 330B, and the valley therebetween, the light blocking material of the portion overlapping the first color conversion layer 330R, the second color conversion layer 330G, and the transmission layer 330B may be removed by only a developing process without a separate mask. Accordingly, the first light blocking layer 335 may only be formed within the valley, thereby realizing the planarization.

In an implementation, as illustrated in FIG. 9, the light filter layer 380 may be positioned between the capping layer 340 and the planarization layer 350 and between the first light blocking member 335 and the capping layer 340. In an implementation, the light filter layer 380 may be positioned between the capping layer 340 and the planarization layer 350 and between the first light blocking layer 335 and the planarization layer 350, or may be positioned between the planarization layer 350 and the polarization layer including the polarization pattern 22. If the light filter layer 380 is formed between the capping layer 340 and the planarization layer 350 and between the first light blocking layer 335 and the capping layer 340, the light filter layer 380 while having the step may be formed in the separation space between the first color conversion layer 330R and the second color conversion layer 330G adjacent to each other, between the first color conversion layer 330R and the transmission layer 330B adjacent to each other, and between the second color conversion layer 330G and the transmission layer 330B adjacent to each other. The light filtering layer 380 may be formed by repeatedly depositing the layers having the different refractive indexes from each other through a process method such as a chemical vapor deposition method on an entire surface, the light filtering layer 380 may also be formed in the above-described separation space, and a phenomenon that the light filtering layer 380 is lifted could be generated. In this way, if the phenomenon that the light filtering layer 380 is lifted is generated, a gas could be emitted through the lifted part of the light filtering layer 380.

According to an embodiment, if the light filtering layer 380 is deposited after the first light blocking layer 335 (serving the planarization function) or the planarization layer 350 is formed, the light filtering layer 380 may be formed to be substantially flat without the step. Accordingly, a degree of the gas being emitted from the layer formed of the organic material like the first and second color conversion layers 330R and 330G, and the transmission layer 330B, may be advantageously reduced.

Figure 10:
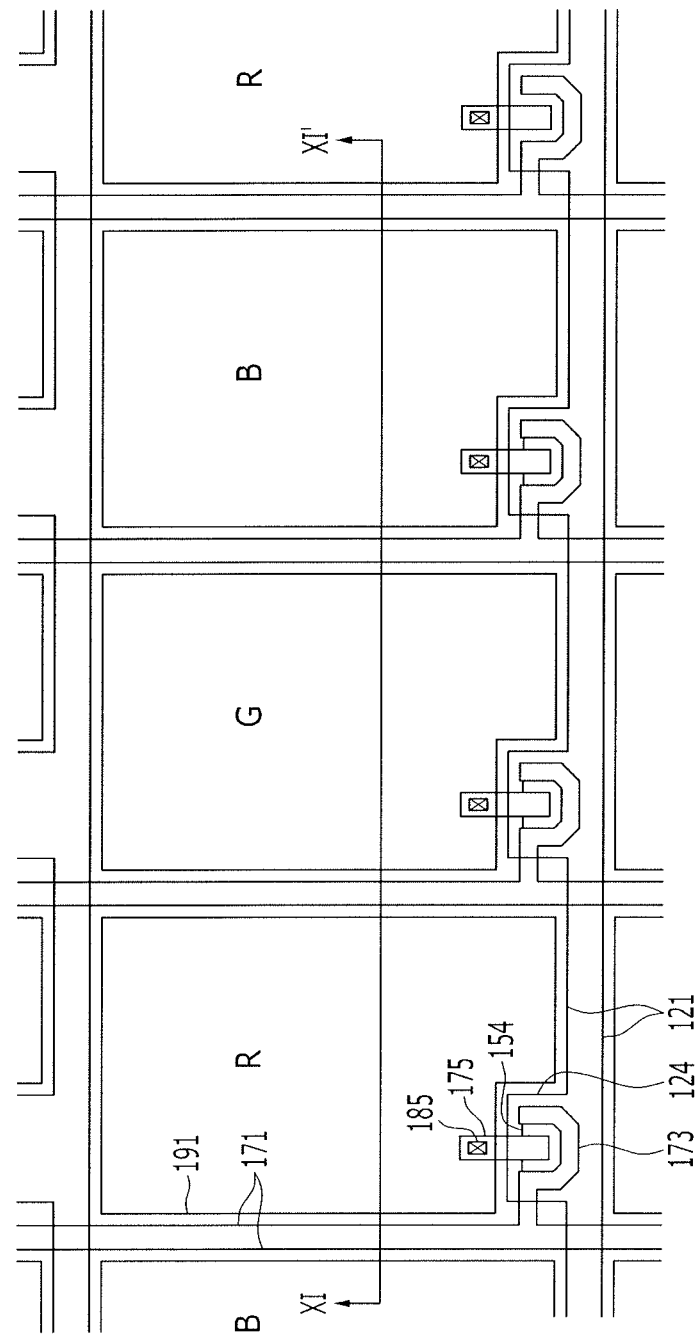
FIG. 10 illustrates a top plan view showing a display device according to an exemplary embodiment of the present disclosure.
Figure 11:
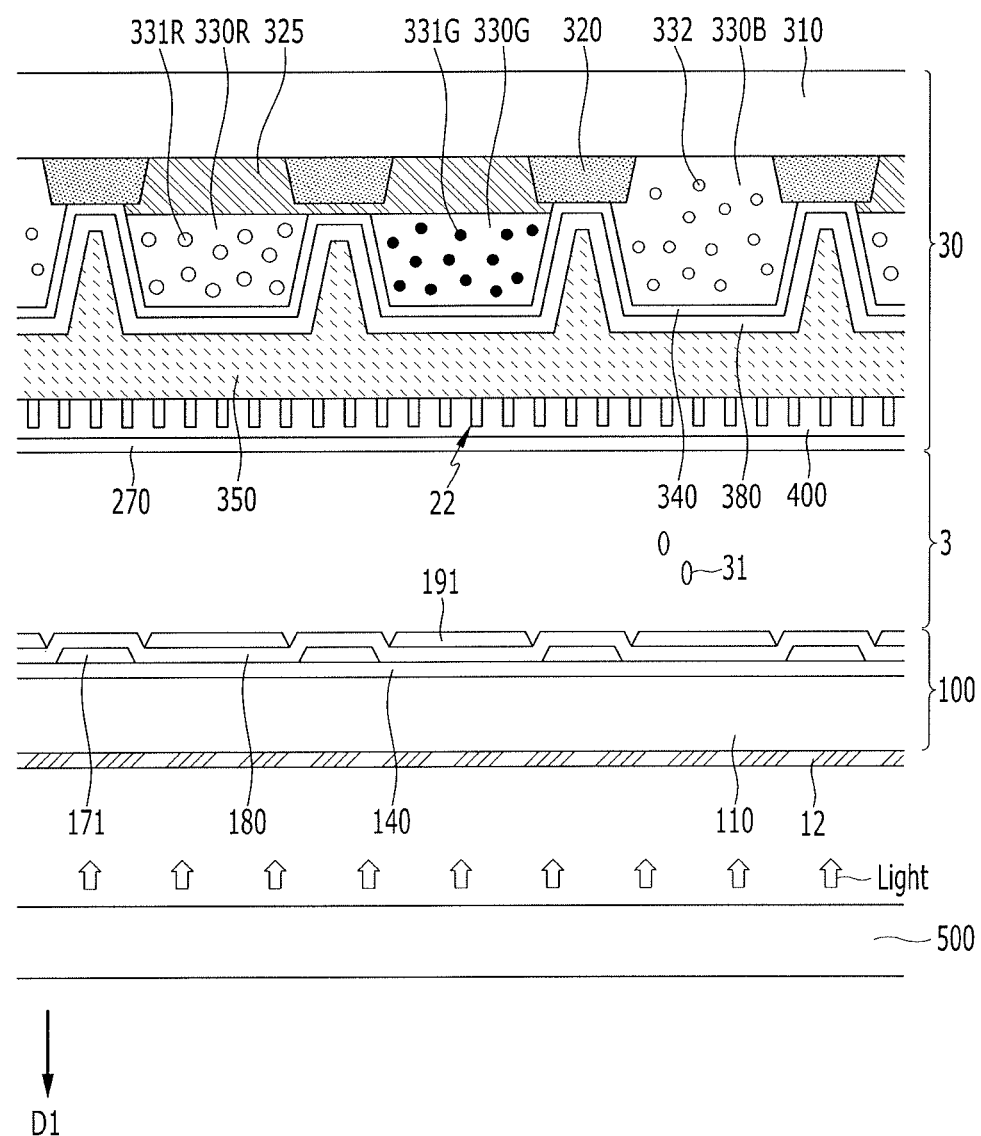
FIG. 11 illustrates a cross-sectional view taken along a line XI-XI' of FIG. 10.

FIG. 10 illustrates a top plan view showing a display device according to an exemplary embodiment of the present disclosure. FIG. 11 illustrates a cross-sectional view taken along a line XI-XI' of FIG. 10.

Referring to FIG. 10 and FIG. 11, the display device may include a light assembly 500, a display panel 100, a color conversion panel 30, and a liquid crystal layer 3. The light assembly 500 (supplying the light being passed in the order of the display panel 100, the liquid crystal layer 3, and the color conversion panel 30) may be positioned to be adjacent to the display panel 100. The liquid crystal layer 3 may be positioned between the display panel 100 and the color conversion panel 30, and may contain a liquid crystal material including a plurality of liquid crystal molecules 31.

The light assembly 500 may include a light source generating the light and a light guide receiving the light generated from the light source to guide the light in a direction in which the display panel 100 and the color conversion panel 30 are positioned.

The light assembly 500 may include at least one light emitting diode (LED), e.g., it may be a blue light emitting diode (LED), and/or may include a green light emitting diode (LED), a white light source, or an ultraviolet ray light source instead of the blue light emitting diode (LED). In the present exemplary embodiment, only the display device using the light assembly 500 including the blue light emitting diode (LED) will be described.

The display device according to the present exemplary embodiment may further include a first polarizer 12 under the display panel 100. The first polarizer 12 may be a coating polarizer, the wire grid polarizer, or the like. The first polarizer 12 may linearly polarize the light that is generated from the light assembly 500 and is not polarized to be incident to the liquid crystal layer 3, a polarization axis of the light incident to the liquid crystal layer 3 is rotated while passing through the liquid crystal layer 3, and the polarization pattern 22 included in the color conversion panel 30 reflects only the polarization component parallel to the polarization pattern 22 and transmits the polarization component perpendicular to the polarization pattern 22 among the light emitted from the liquid crystal layer 3.

Next, the display panel 100 will be described in detail.

Referring to FIG. 10 and FIG. 11, the display panel 100 may include a gate line 121 extending in a row direction on a first substrate 110 and including a gate electrode 124, a gate insulating layer 140 positioned on the gate line 121, a semiconductor layer 154 positioned on the gate insulating layer 140, a data line 171 positioned on the semiconductor layer 154 and extending in a column direction, a source electrode 173 connected to the data line 171, a drain electrode 175 facing the source electrode 173, a passivation layer 180 positioned on the data line 171 and the drain electrode 175, and a pixel electrode 191 electrically connected to the drain electrode 175 through a contact hole 185 of the passivation layer 180 and formed in the passivation layer 180. Pixel electrodes 191 may be positioned in a matrix shape, and the shape and the arrangement of the pixel electrodes 191 may be changed.

A plurality of pixel electrodes 191 may be formed in each pixel area. The semiconductor layer 154 positioned on the gate electrode 124 may form a channel layer between the source electrode 173 and the drain electrode 175, and the gate electrode 124, the semiconductor layer 154, the source electrode 173, and the drain electrode 175 may form one thin film transistor. The light blocking part overlapping the thin film transistor may be formed to be adjacent to the region overlapping the gate line 121 and the data line 171.

Next, the color conversion panel 30 will be described.

The color conversion panel 30 overlapping the above-described display panel 100 may be the color conversion panel described in FIG. 8. The color conversion panel may be positioned on the display panel 100 in an inverted state to position the substrate 310 of the color conversion panel 30 away from an uppermost part of the display panel 100 shown in FIG. 1. A common electrode 270 may be positioned on the liquid crystal layer 3, and the polarization layer corresponding to the second polarizer is positioned on the common electrode 270, thereby forming an in-cell polarizer. The polarization layer, as described above, may be made of the polarization pattern 22 (including the metal material) and the insulating layer 400. If the in-cell polarizer is formed, the light path may be reduced.

In an implementation, an alignment layer may be formed between the liquid crystal layer 3 and the pixel electrode 191 and between the liquid crystal layer 3 and the common electrode 270. The first polarizer 12 positioned under the display panel 100 and the second polarizer included in the conversion panel 30 may polarize the light incident from the light assembly 500.

The common electrode 270 applying the common voltage may form an electric field along with the pixel electrode 191 such that each long axis of the liquid crystal molecules 31 positioned in the liquid crystal layer 3 is inclined in a direction perpendicular or parallel to the electric field. The degree of polarization of the light that is incident to the liquid crystal layer 3 may be changed depending on the inclination degree of the liquid crystal molecules 31, and this change of polarization appears as a change of transmittance by the polarizer such that the liquid crystal display displays an image. In an implementation, it is possible for the electric field to be formed with the pixel electrode 191 via the insulating layer in the display panel 100.

The contents related to the color conversion panel described in FIG. 8 may all be applied to the present exemplary embodiment.

The above-described display device may provide the improved color reproducibility and contrast ratio through the color conversion panel. Also, an upper panel overlapping the display panel functioning as the lower panel may not be separately formed, and the color conversion panel 30 may be substituted for the upper panel. Accordingly, the display device according to the present exemplary embodiment provides a device of a thinner thickness and there are merits of reducing the cost and the weight.

In an implementation, the alignment layer may be formed between the liquid crystal layer 3 and the pixel electrode 191 and between the liquid crystal layer 3 and the common electrode 270.

The color conversion panel according to an exemplary embodiment of the present invention may be applied to the liquid crystal display or may be applied to an organic light emitting diode display.

When being applied to the organic light emitting diode display, the emission layer may emit the blue or white light, and the red light, the green light, and the blue light may be emitted through the color conversion panel. In this case, as the emission layer, the quantum dot doped with the metal material according to an exemplary embodiment of the present disclosure as described above may be applied as well as the organic material. In an implementation, the present disclosure may be applied to an emissive display device (micro-LED) having a structure in which a plurality of light emitting diodes (LED) are formed on the substrate.

By way of summation and review, as a quantum dot light emission material, a Group II-VI compound semiconductor having high quantum efficiency and excellent stability may be used. A quantum dot material of a core-shell structure using Cd such as CdSe/ZnS and CdZnS/ZnS as a core material may have high PL (photoluminance) quantum efficiency. The core constituent of the quantum dot may include Cd, which is harmful to the environment and a human body, and a quantum dot material without Cd, and an element and a device using the quantum dot material, have been considered.

A shell of the quantum dot of the core-shell structure may help protect an electron or a hole of the core from the outside. The core and the shell may be oxidized by the external environment, so efficiency of the quantum dot could possibly be low.

The embodiments may provide a quantum dot that helps minimize an effect of the external environment.

According to the exemplary embodiments, the quantum dot with improved quantum efficiency, the color conversion panel, and the display device including the same may be realized by the metal doping material.

Also, by forming the light blocker having the planarization function, the polarization function of an in-cell polarizer may be improved.

DESCRIPTION OF SYMBOLS

10: core
20: shell layer
22: polarization pattern
330R: first color conversion layer
330G: second color conversion layer
330B: transmission layer
335: first light blocking member
320: second light blocking member
340: capping layer
350: planarization layer
380: light filter layer Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A color conversion panel, comprising:
a substrate;
a first color conversion layer and a second color conversion layer positioned on the substrate; and
a planarization layer covering the first color conversion layer and the second color conversion layer, wherein:
each of the first color conversion layer and the second color conversion layer includes a plurality of semiconductor nanoparticles,
each semiconductor nanoparticle of the plurality of semiconductor nanoparticles includes a core and a shell layer positioned outside of the core, the shell layer comprising a first portion and a second portion, the second portion being farther from the core than the first portion, and
the second portion of the shell layer is doped with aluminum oxide, silicon oxide, titanium oxide, magnesium oxide, or zinc oxide to have a different composition than the first portion.

2. The color conversion panel as claimed in claim 1, wherein the core includes a Group III-V compound.

3. The color conversion panel as claimed in claim 2, wherein:
the core further includes a Group II-VI compound, and
the core includes an alloy of the Group III-V compound and the Group II-VI compound.

4. The color conversion panel as claimed in claim 1, further comprising a light filter layer positioned between the planarization layer and the first color conversion layer and positioned between the planarization layer and the second color conversion layer, wherein:
the light filter layer includes a plurality of layers, and
the plurality of layers have a structure in which at least two layers having different refractive indexes are alternately arranged.

5. The color conversion panel as claimed in claim 1, further comprising a polarization layer comprising:
a polarization pattern including a metal material, and
an insulating layer covering the polarization pattern.

6. The color conversion panel as claimed in claim 1, further comprising a light blocking layer positioned between the first color conversion layer and the second color conversion layer.

7. The color conversion panel as claimed in claim 1, wherein:
the first portion is adjacent to the core.

8. The color conversion panel as claimed in claim 1, wherein
the core and the first portion of the shell layer are doped with aluminum, silicon, titanium, magnesium, or zinc.

9. A display device, comprising:
a display panel; and
the color conversion panel of claim 1.

10. The display device as claimed in claim 9, further comprising a polarization layer comprising:
a polarization pattern including a metal material, and
an insulating layer covering the polarization pattern.

11. The display device as claimed in claim 9, wherein the color conversion panel further includes a light blocking layer positioned between the first color conversion layer and the second color conversion layer.

12. The display device as claimed in claim 11, wherein a width of the light blocking layer gradually increases along a direction from the substrate toward the planarization layer.

13. The display device as claimed in claim 9, wherein the core includes:
a Group III-V compound, or an alloy of the Group III-V compound and a Group II-VI compound.

* * * * *